(12) United States Patent
Tai

(10) Patent No.: US 9,467,159 B1
(45) Date of Patent: Oct. 11, 2016

(54) ANALOG-TO-DIGITAL CONVERTING DEVICE AND RELATED CALIBRATION METHOD AND CALIBRATION MODULE

(71) Applicant: Sitronix Technology Corp., Hsinchu County (TW)

(72) Inventor: Hung-Yen Tai, Hsinchu County (TW)

(73) Assignee: Sitronix Technology Corp., Hsinchu County (TW)

( * ) Notice: Subject to any disclaimer, the term of this patent is extended or adjusted under 35 U.S.C. 154(b) by 0 days.

(21) Appl. No.: 14/930,673

(22) Filed: Nov. 3, 2015

Related U.S. Application Data

(60) Provisional application No. 62/173,964, filed on Jun. 11, 2015.

(51) Int. Cl.
*H03M 1/10* (2006.01)
*H03M 1/44* (2006.01)

(52) U.S. Cl.
CPC ........... *H03M 1/1033* (2013.01); *H03M 1/442* (2013.01)

(58) Field of Classification Search
USPC .................................. 341/118, 120, 161–163
See application file for complete search history.

(56) References Cited

U.S. PATENT DOCUMENTS

| | | | | |
|---|---|---|---|---|
| 4,399,426 A | * | 8/1983 | Tan | H03M 1/183 341/120 |
| 4,970,514 A | * | 11/1990 | Draxelmayr | H03M 1/1042 324/130 |
| 8,378,863 B2 | * | 2/2013 | Ishikawa | H03M 1/00 341/118 |
| 8,451,151 B2 | * | 5/2013 | Lin | H03M 1/1061 341/110 |
| 8,519,874 B2 | * | 8/2013 | Aruga | H03M 1/1019 341/120 |
| 8,674,862 B1 | * | 3/2014 | Li | H03M 1/10 341/120 |
| 8,947,290 B2 | * | 2/2015 | Miki | H03M 1/1061 341/118 |
| 2004/0227652 A1 | | 11/2004 | Draxelmayr | |
| 2013/0044014 A1 | | 2/2013 | Lin | |
| 2014/0077979 A1 | | 3/2014 | Miki | |

FOREIGN PATENT DOCUMENTS

TW 201015870 4/2010
TW 201322641 A1 6/2013

OTHER PUBLICATIONS

Thakur et al., Low-Power Architectures and Self-Calibration Techniques of DAC for SAR-ADC implementation, International Journal of Innovative Research in Electrical, Electronics, Instrumentation and Control Engineering vol. 2, Issue 3, Mar. 2014.*
H.Y.Tai, P.Y. Tsai, C.H. Tsai and H. S. Chen, "A 0.004mm2 single-channel 6-bit 1.25GS/s SAR ADC in 40nm CMOS," Solid-State Circuits Conference(A-SSCC), 2013 IEEE Asian, Singapore, 2013, pp. 277-280.
H. Y. Tai, H.W. Chen and H. S. Chen, "A 3.2fJ/c.-s. 0.35V 10b 100KS/s SAR ADC in 90nm CMOS, " 2012 Symposium on VLSI Circuits Digest of Technical Papers, Honolulu, HI, 2012, pp. 92-93.

* cited by examiner

*Primary Examiner* — Howard Williams
(74) *Attorney, Agent, or Firm* — Winston Hsu; Scott Margo

(57) ABSTRACT

An analog-to-digital converting device includes a converting module, for sampling an analog input voltage according to a plurality of sampling signals to generate a comparing voltage and generating a comparing signal according to the comparing voltage, wherein the converting module comprises a plurality of capacitors and each of the plurality of capacitors couples between one of the plurality sampling signals and the comparing voltage; a control module, for adjusting the plurality of sampling signals according to the comparing signal, to generate a digital signal corresponding to the analog input voltage, wherein a plurality of bits of the digital signal are respectively corresponding to the capacitances of the plurality of capacitors; and a calibration module, for adjusting the capacitances of the plurality of capacitors according to the digital signal.

9 Claims, 5 Drawing Sheets

| Converting times | W10~W1 | DOUT | Adjusted W10-W1 |
|---|---|---|---|
| 1 | 513 256 128 64 32 16 8 4 2 1 | 0111111111 | 513-0.5 256 128 64 32 16 8 4 2 1 |
| 2 | 512.5 256 128 64 32 16 8 4 2 1 | 0111111111 | 512.5-0.5 256 128 64 32 16 8 4 2 1 |
| 3 | 512 256 128 64 32 16 8 4 2 1 | 0111111111 | 512-0.5 256 128 64 32 16 8 4 2 1 |
| 4 | 511.5 256 128 64 32 16 8 4 2 1 | 0111111110 | 511.5+0.5 256 128 64 32 16 8 4 2 1 |
| 5 | 512 256 128 64 32 16 8 4 2 1 | 0111111111 | 512-0.5 256 128 64 32 16 8 4 2 1 |
| 6 | 511.5 256 128 64 32 16 8 4 2 1 | 0111111110 | 511.5+0.5 256 128 64 32 16 8 4 2 1 |

FIG. 3

ANALOG-TO-DIGITAL CONVERTING DEVICE AND RELATED CALIBRATION METHOD AND CALIBRATION MODULE

CROSS REFERENCE TO RELATED APPLICATIONS

This application claims the benefit of U.S. Provisional Application No. 62/173,964, filed on 2015 Jun. 11, the contents of which are incorporated herein in their entirety.

BACKGROUND OF THE INVENTION

1. Field of the Invention

The present invention relates to an analog-to-digital converting device and related calibration method and calibration module, and more particularly, to an analog-to-digital converting device capable of eliminating non-ideal effects of the process variation according to the digital output signal and related calibration method and calibration module.

2. Description of the Prior Art

A successive approximation register (SAR) analog-to-digital converter (ADC) is a type of ADC applying the binary search algorithm in the analog-to-digital conversion process. Generally, the conversion time of the SAR ADC is limited by the external conversion clock. In each clock period of the conversion clock, the SAR ADC samples an analog input and generates bits of a corresponded digital output bit by bit from the most significant bit (MSB) to the least significant bit (LSB).

When the circuit components in the SAR ADC deviates from the original designs as a result of process variations, the resolution of the SAR ADC is downgraded. The non-ideal effects resulting from the process variation can be reduced via increasing the areas of the circuit components. However, the increases in the areas of the circuit components raise the power consumption and increase the chip area of the SAR ADC. Thus, how to reduce the non-ideal effects of the process variation without affecting the circuit performance and the manufacturing cost becomes a topic to be discussed.

SUMMARY OF THE INVENTION

In order to solve the above problem, the present invention provides an analog-to-digital converting device capable of eliminating non-ideal effects of the process variation and related calibration method and calibration module.

The present invention discloses an analog-to-digital converting device. The analog-to-digital converting device comprises a converting module, for sampling an analog input voltage according to a plurality of sampling signals to generate a comparing voltage and generating a comparing signal according to the comparing voltage, wherein the converting module comprises a plurality of capacitors and each of the plurality of capacitors couples between one of the plurality sampling signals and the comparing voltage; a control module, for adjusting the plurality of sampling signals according to the comparing signal, to generate a digital signal corresponding to the analog input voltage, wherein a plurality of bits of the digital signal are respectively corresponding to the capacitances of the plurality of capacitors; and a calibration module, for adjusting the capacitances of the plurality of capacitors according to the digital signal.

The present invention further discloses a calibration method for an analog-to-digital converting device, which converts an analog input voltage to a digital signal with a plurality of bits and the bits other than the least significant bit among the plurality of bits are corresponding to capacitances of a plurality of capacitors in the analog-to-digital converting device. The calibration method comprises detecting whether a first bit is different from the bits between the first bit and the least significant bit among the plurality of bits; and adjusting a capacitance of a first capacitor corresponding to the first bit according to the first bit and the least significant bit when the first bit is different from the bits between the first bit and the least significant bit among the plurality of bits.

The present invention further discloses a calibration module for an analog-to-digital converting device, which converts an analog input voltage to a digital signal with a plurality of bits and the bits other than the least significant bit among the plurality of bits are corresponding to capacitances of a plurality of capacitors in the analog-to-digital converting device. The calibration module comprises a processing unit; and a storage unit, for storing a program code instructing the processing unit perform the following steps: detecting whether a first bit is different from the bits between the first bit and the least significant bit among the plurality of bits; and adjusting a capacitance of a first capacitor corresponding to the first bit according to the first bit and the least significant bit when the first bit is different from the bits between the first bit and the least significant bit among the plurality of bits.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 3 is a schematic diagram of related signals of the analog-to-digital converting device shown in FIG. 2.

DETAILED DESCRIPTION

Figure 1:
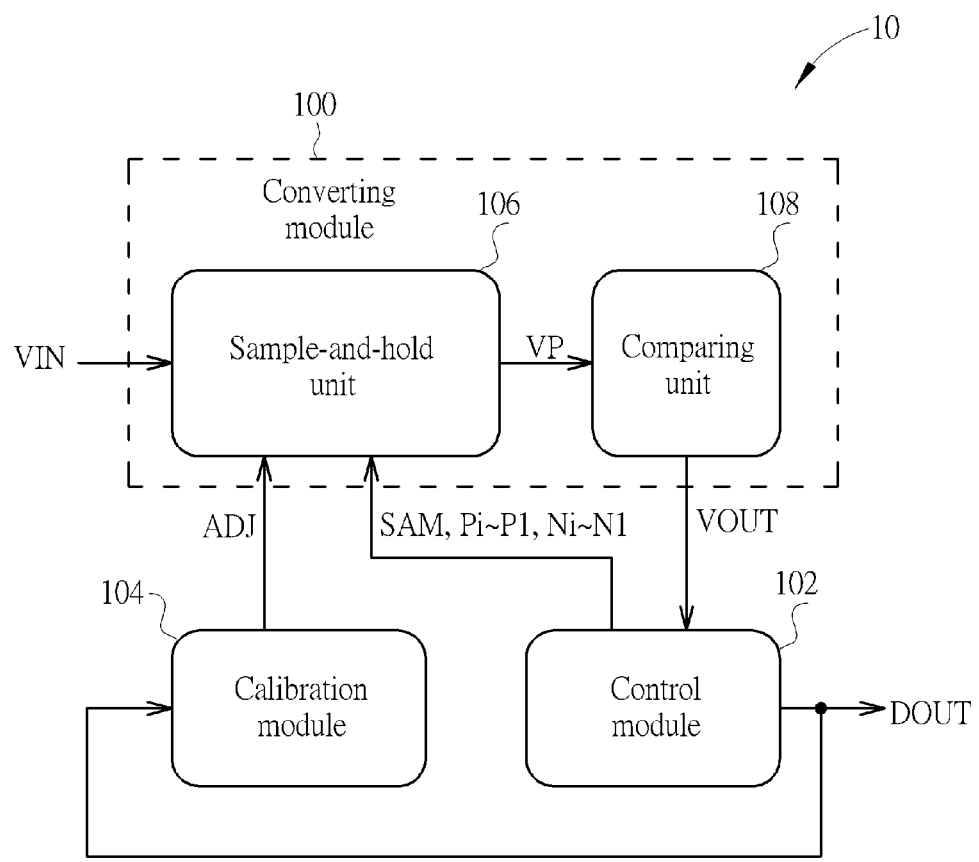
FIG. 1 is a schematic diagram of an analog-to-digital device according to an example of the present invention.

Please refer to FIG. 1, which is schematic diagram of an analog-to digital converting device 10 according to an example of the present invention. The analog-to-digital converting device 10 may be a successive approximation register (SAR) analog-to-digital converter (ADC) and is utilized for converting an analog input voltage VIN to a digital output signal DOUT. As shown in FIG. 1, the analog-to-digital converting device 10 comprises a converting module 100, a control module 102, and a calibration module 104. The converting module 100 comprises a sample-and-hold unit 106 and a comparing unit 108. The converting module 100 is utilized to sample the analog input voltage VIN according to sampling signals SAM, Pi-P1, and Ni-N1 to generate a comparing voltage VP and to generate a comparing signal VOUT according to the comparing voltage VP. The sample-and-hold unit 106 comprises a capacitor array CA and each of a plurality of capacitors CiP-C1P and CiN-C1N (not shown in FIG. 1) in the capacitor array CA is coupled between one of the sampling signals Pi-P1 and Ni-N1 and the comparing voltage. The control module 102 adjusts the sampling signals SAM, Pi-P1, and Ni-N1 according to the comparing signal VOUT, to acquire bits Di-D0 of the digital output signal DOUT. The bits Di-D1 are corresponding to weights Wi-W1 and the sampling signals Pi-P1 and Ni-N1, and the weights Wi-W1 are corresponding to capacitances of the capacitors CiP-C1P and CiN-C1N. According to the digital output signal DOUT, the calibration module 104 adjusts the capacitances of the capacitors CiP-C1P and CiN-Cln via an adjusting signal ADJ, to eliminate the non-ideal effects generated by the process variation.

When the analog-to-digital converting device 10 begins operating, the sample-and-hold unit 106 samples the analog input voltage VIN according to the sampling signal SAM, to generate the comparing signal VP. The comparing unit 108 generates the comparing signal VOUT according to the comparing voltage VP. According to the comparing signal VOUT, the control module 102 generates the most-significant bit Di of the digital output signal DOUT and adjusts the sampling signals Pi and Ni. After the sample-and-hold unit 106 adjusts the comparing voltage VP according to the sampling signals Pi and Ni and via the capacitors CiP-C1P and CiN-C1N, the control module 102 generates the bit Di-1 subsequent to the bit Di according to the comparing signal VOUT and adjusts the sampling signals Pi-1 and Ni-1. Via repeating the above processes, the control module 102 sequentially generates the bits Di-D0 of the digital output signal DOUT, wherein the bits Di-D1 are corresponding to the weights Wi-W1 and the weights Wi-W1 are proportional to the capacitances CiP-C1P and CiN-C1N, respectively. After acquiring the bit D1 and adjusting the sampling signals P1 and N1, the control module 102 further generates the bit D0 according to the comparing signal VOUT.

Next, the calibration module 104 adjusts the capacitances of the capacitors CiP-C1P and CiN-C1N in the capacitor array CA according to the bits Di-D0 of the digital output signal DOUT generated by the control module 102. When a bit Dx among the bits Di-D1 (i.e. the bits Di-D0 excluding the least significant bit D0) is different from the bits between the bit Dx and the bit D0 (i.e. the bits (Dx−1)-D1), the calibration module 104 adjusts the capacitances of the capacitors CxP and CxN corresponding to the bit Dx according to the bits Dx and D0. The calibration module 104 decreases the capacitances of the capacitors CxP and CxN via the adjusting signal ADJ when the bit Dx is different from the bits (Dx−1)-D1 and the bit DX is different from the bit D0; and increases the capacitances of the capacitors CxP and CxN via the adjusting signal ADJ when the bit Dx is different from the bits (Dx−1)-D1 and the bit DX is the same as the bit D0. The non-ideal effects generated by the mismatches among the capacitors CiP-C1P and CiN-C1N of the capacitor array CA are eliminated, therefore.

Figure 2:
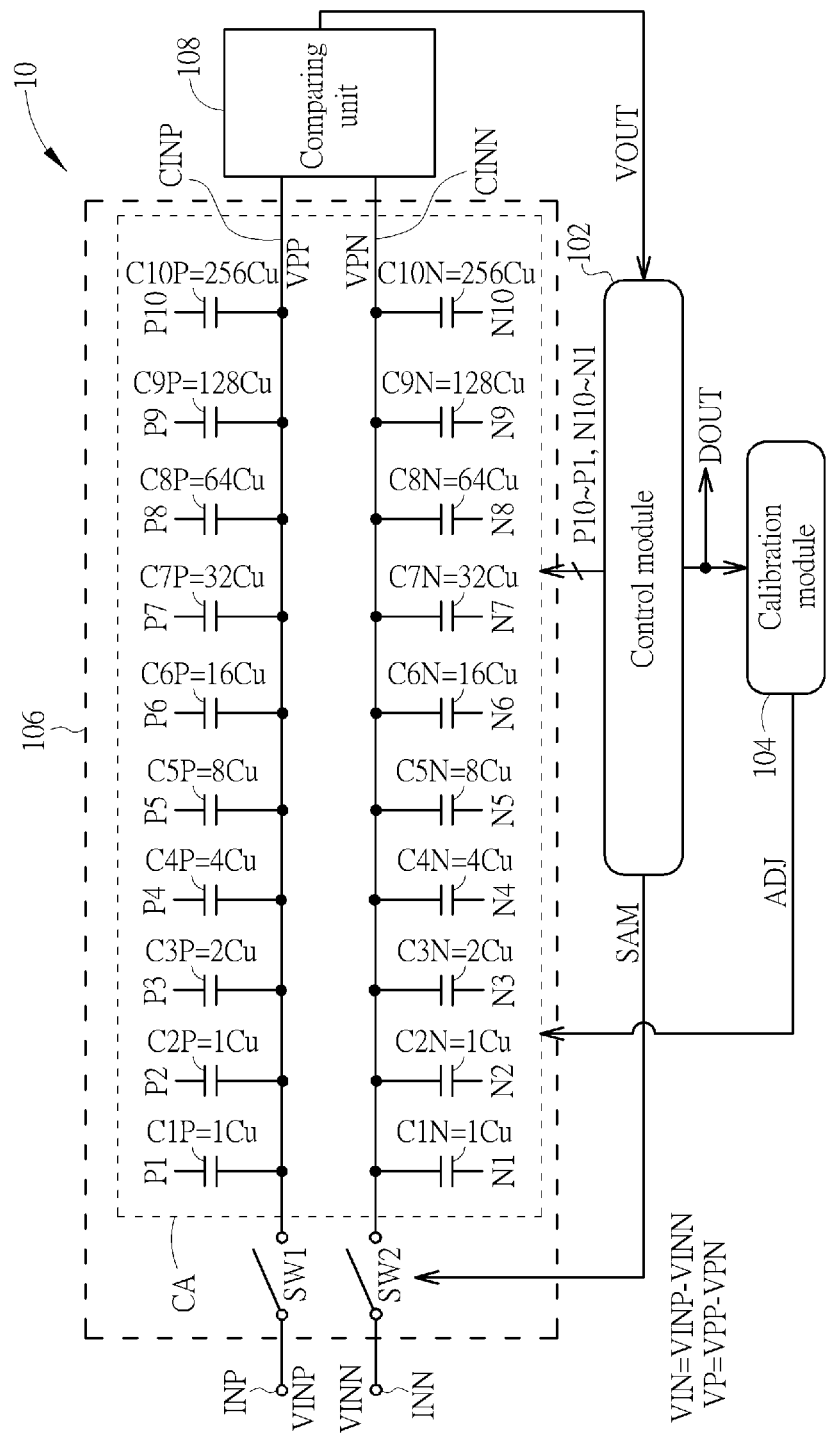
FIG. 2 is a schematic diagram of an implementation of the analog-to-digital converting device shown in FIG. 1.

As to the detailed operations of the analog-to-digital converting device 10 shown in FIG. 1 please refer to FIG. 2, which is an implementation of the analog-to-digital converting device 10 shown in FIG. 1. In FIG. 2, the analog-to-digital converting device 10 is a 10 bits SAR ADC, the analog input voltage VIN is the voltage difference between a voltage VINP of an input end INP and a voltage VINN of an input end INN (i.e. VIN=VINP−VINN), and the comparing voltage VP is a voltage difference between a comparing voltage VPP of an input end CINP of the comparing unit 108 and a comparing voltage VPN of an input end CINN of the comparing unit 108 (i.e. VP=VPP−VPN). The sample-and-hold unit 106 comprises switches SW1 and SW2 and the capacitor array CA with capacitors C10P-C1P and C10N-C1N. Each of the capacitors C1P-C10P is coupled between one of the sampling signals P1-P10 and the input end VPP and each of the capacitors C1N-C10N is coupled between one of the sampling signals N1-N10 and the input end VPN. The capacitors C1P and C1N are corresponding to the bit D1 and the capacitances of the capacitors C1P and C1N are proportional to the weight W1; the capacitors C2P and C2N are corresponding to the bit D2 and the capacitances of the capacitors C2P and C2N are proportional to the weight W2; and so on. In the example, the weights W10-W1 are [512 256 128 64 32 8 4 2 1]. The capacitances of the capacitors C10P and C10N are 256Cu (Cu is a unit capacitance), the capacitances of the capacitors C9P and C9N are 128Cu, and so on. Note that the capacitances of the capacitors C1P and C1N are designed to be Cu and are the same as the capacitances of the capacitors C2P and C2N.

When the analog-to-digital converting device 10 shown in FIG. 2 begins operating, the control module 102 switches the sampling signal SAM to disconnect the switches SW1 and SW2. The comparing voltage VP is equal to the analog input voltage VIN and the sampling signals P10-P1 and N10-N1 are a power voltage VDD of the analog-to-digital converting device 10. Next, the comparing unit 108 generates the comparing signal VOUT according to the comparing voltage VP and the control module 102 generates the bit D10 of the digital output signal DOUT according to the comparing signal VOUT. When the comparing voltage VPP is greater than the comparing voltage VPN, the control module 102 adjusts the bit D10 to a high logic level (i.e. "1"), adjusts the sampling signal P10 to ground voltage, and keeps the sampling signal N10 at the power voltage VDD; and when the comparing voltage VPP is smaller than the comparing voltage VPN, the control module 102 adjusts the bit D10 to a low logic level (i.e. "0"), keeps the sampling signal P10 at the power voltage VDD, and adjusts the sampling signal N10 to the ground voltage. After the bit D0 is generated and the sampling signals P10 and N10 are adjusted, the comparing unit 108 generates the comparing signal VOUT according to the adjusted comparing voltages VPP and VPN and the control module 102 generates the bit D9 and adjusts the sampling signals P9 and N9. Via repeating the process of generating the bits D10 and D9, the control module 102 sequentially generates the bits D8-D1 of the digital output signal DOUT. After acquiring the bit D1 and adjusting the sampling signals P1 and N1 according to the bit D1, the control module 102 generates the bit D0 according to the comparing signal VOUT.

Because the capacitances of the capacitors C1P-C10P and C1N-C10N may deviate from the originally designed values due to process variation, the calibration module 104 adjusts the capacitances of the capacitors C1P-C10P and C1N-C10N according to the bits D10-D0 generated by the control module 102, to eliminate the non-ideal effect of the process variation. In order to simplify illustrations, the voltages and signals are represented by digital weights in the following illustrations. In an example, the ideal digital weight of the analog input voltage (i.e. the initial value of the comparing voltage VP) is 512 and the weight W10 changes to be W10' because the capacitances of the capacitors C10P and C10N deviates from the originally designed values. According to the abovementioned processes, the control module generates "1000000000" as the bits D10-D0. Under such a condition, the comparing voltage VP=512−W10'+256+128+64+32+16+8+4+2+1=1023−W10'. If the capacitances of the capacitors C10P and C10N become greater than the original designed value 256Cu due to the process variation (i.e. the weight W10' is greater than the original designed value 512), the control module 102 acquires "0" as the bit D0; and if the capacitances of the capacitors C10P and C10N become smaller than the original designed value 256Cu due to the process variation, the control module 102 acquires "1" as the bit D0. Thus, the calibration module 104 determines the capacitances of the capacitors C10P and C10N becomes greater than the originally designed values 256Cu when the bit D10 is different from the bits D9-D1 and the bit D10 is different from the bit D0, and decreases the capacitances of the capacitors C10P and C10N via the adjusting signal ADJ; and determines the capacitances of the capacitors C10P and C10N becomes smaller than the originally designed values 256Cu when the bit D10 is different from the bits D9-D1 and the bit D10 is the same as the bit D0, and increases the capacitances of the capacitors C10P and C10N via the adjusting signal ADJ.

According to the concept of adjusting the capacitances of the capacitors C10P and C10N, the calibration module 104 adjusts the capacitances of the capacitors C10P-C1P and C10N-C1N, to eliminate the non-ideal effects generated by the mismatches of the capacitors C10P-C1P and C10N-C1N.

Please refer to FIG. 3, which is a schematic diagram of related signals of the analog-to-digital converting device 10 shown in FIG. 2. In FIG. 3, the capacitances of the capacitors C10P and C10N deviate from the originally designed values, such that the weight W10 changes from 512 to 513. In first converting process, the control module 102 acquires "01111111111" as the bits D10-D0. Since the bit D10 is different from the bits D9-D1 and the bit D10 is different from the bit D0, the calibration module 104 decreases the capacitances of the capacitors C10P and C10N a step value (e.g. 0.25Cu) via the adjusting signal ADJ, to subtract 0.5 from the weight W10. Similarly, the control module 102 acquires "01111111111" as the bits D10-D0 in second and third converting processes and the calibration module 104 decreases the capacitances of the capacitances of the capacitors C10P and C10N to subtract 0.5 from the weight W10 in each of the second and the third converting processes.

In fourth converting process, the bits D10-D0 acquired by the control module become "01111111110". Since the bit D10 is different from the bits D9-D1 and the bit D10 is the same as the bit D0, the calibration module 104 increases the capacitances of the capacitors C10P and C10N by the step value (e.g. 0.25Cu) to add 0.5 to the weight W10. In fifth converting process, the bits D10-D0 acquired by the control module become "01111111111". Since the bit D10 is different from the bits D9-D1 and the bit D10 is different from the bit D0, the calibration module 104 decreases the capacitances of the capacitors C10P and C10N by the step value to subtract 0.5 from the weight W10. In sixth converting process, the bits D10-D0 acquired by the control module become "01111111110". Since the bit D10 is different from the bits D9-D1 and the bit D10 is the same as the bit D0, the calibration module 104 increases the capacitances of the capacitors C10P and C10N by the step value (e.g. 0.25Cu) to add 0.5 to the weight W10.

Under the condition that the capacitances of the capacitors C10P and C10N deviates from the originally designed values, the calibration module 104 adjusts the capacitances of the capacitors C10P and C10N when the control module 102 generates the digital output signal DOUT with the specific patterns as shown in FIG. 3, to calibrate the capacitances of the capacitors C10P and C10N to the originally designed values (e.g. 256Cu). After the capacitances of the capacitors C10P and C10N are calibrated to the originally designed values (e.g. after the third converting process shown in FIG. 3), the capacitances of the capacitors C10P and C10N are switched between the originally designed values and the capacitance whose difference with respect to the originally designed values is the single step value (e.g. 256Cu and 255.75Cu). In order to make the calibrated capacitances of the capacitors C10P and C10N approximated to the originally designed values, the step value of each time the calibration module 104 adjusting the capacitances may be shrank (e.g. from 0.25Cu to 0.125Cu).

When the digital output signal performs the specific patterns, the calibration module of the above examples adjusts the capacitances of the capacitors in the capacitor array of the analog-to-digital converting device, to eliminate the non-ideal effects generated by the mismatches among the capacitors of the capacitor array. Since the calibration module detects whether the digital output signal performs the specific patterns to decide whether to adjust the capacitance of the capacitors in the capacitor array, the calibration module calibrates the mismatches among the capacitors in the capacitor array as long as the analog input voltage comprises the analog voltages corresponding to the specific patterns. For example, the analog input voltage VIN of the above examples can be sin-wave voltage, ramp voltage or random voltage, and is not limited herein. Furthermore, the calibration module can perform the calibration process not only when the analog-to-digital converting device stops operating but also when the analog-to-digital converting device performs normal operations.

According to different applications and designed concepts, those with ordinary skill in the art may observe appropriate alternations and modifications. For example, the analog-to-digital converting device 10 may counts the number of times of the digital output signal DOUT performs each of the specific patterns and adjusts the capacitor array CA when the number of times of the digital output signal DOUT performs one of the specific patterns exceeds a threshold. Under such a condition, the accuracy of adjusting the capacitor array CA can be improved. For example, the analog-to-digital converting device 10 shown in FIG. 2 counts the number of times of the digital output signal DOUT is "10000000000" or "10000000001". When the number of times of the digital output signal DOUT is "10000000000" reaches 5 (i.e. the threshold is 4), the analog-to-digital converting device 10 decreases the capacitances of the capacitors C10P and C10N in the capacitor array; and when the number of times of the digital output signal DOUT is "10000000001" reaches 5 (i.e. the threshold is 4), the analog-to-digital converting device 10 increases the capacitances of the capacitors C10P and C10N in the capacitor array.

In addition, the analog-to-digital converting devices 10 shown in FIGS. 1 and 2 are realized in differential inputs structure. Those with ordinary skill in the art may change to use the single input structure to realize the analog-to-digital converting device 10. In the analog-to-digital converting device realized in the single input structure, the analog input voltage is coupled to the single input of the comparing unit in the converting module. That is, the comparing voltage becomes the voltage of the single input of the comparing unit.

In addition, the analog-to-digital converting device 10 may adjust the capacitances of some of capacitors C10P-C1P and C10N-C1N. In an example, the capacitors C10P-C8P and C10N-C8N are variable capacitors and the capacitors C7P-C1P and C7N-C1N are fixed capacitors. The calibration module 104 changes to adjust the capacitances of the capacitors C10P-C8P and C10N-C8N according to the bits D10-D0 of the digital output signal DOUT. In the example, the calibration module 104 adjusts the capacitances of the capacitors C10P-C8P and C10N-C8N when one of the bits D10-D8 is different from the bits between itself and the bit D0. For example, the calibration module 104 decreases the capacitances of the capacitors C9P and C9N when the bit D9 is different from the bits D8-D1 and the bit D9 is different from the bit D0; and the calibration module 104 increases the capacitances of the capacitors C9P and C9N when the bit D9 is different from the bits D8-D1 and the bit D9 is the same as the bit D0. In another example, the calibration module 104 changes to adjust the capacitances of the capacitors C10P-C6P and C10N-C6N according to the bits D10-D0 of the digital output signal DOUT and keeps the capacitances of the capacitors C5P-C1P and C5N-C1N the same. The detailed operations of the analog-to-digital converting device 10 adjusting the capacitances of the capacitors C10P-C6P and C10N-C6N can be referred to the above and are not narrated herein for brevity.

According to different applications and designed concepts, the ratio between the variable capacitors and the fixed capacitors in the capacitors C10P-C1P and C10N-C1N can be appropriately altered. As long as the capacitors C10P-C1P and C10N-C1N comprises at least one set of variable capacitors (e.g. the capacitors C10P and C10N), the analog-to-digital converting device 10 can perform the calibration process of the above examples to calibrate the capacitances of the variable capacitors.

The analog-to-digital converting device 10 shown in FIGS. 1 and 2 may further comprise a storage module (not shown in FIGS. 1 and 2) for storing the calibration results of the calibration module 104. Under such a condition, the analog-to-digital converting device 10 stores the calibration results to the storage module after completing the calibration processes. When the analog-to-digital converting device 10 reboots, the analog-to-digital converting device 10 reads the calibration results stored in the storage module as the reference of adjusting the capacitor array CA. The storage module may be a read-only memory (ROM), random-access memory (RAM), CD-ROM/DVD-ROM, magnetic tape, hard disk, and an optical data storage device.

Figure 4:
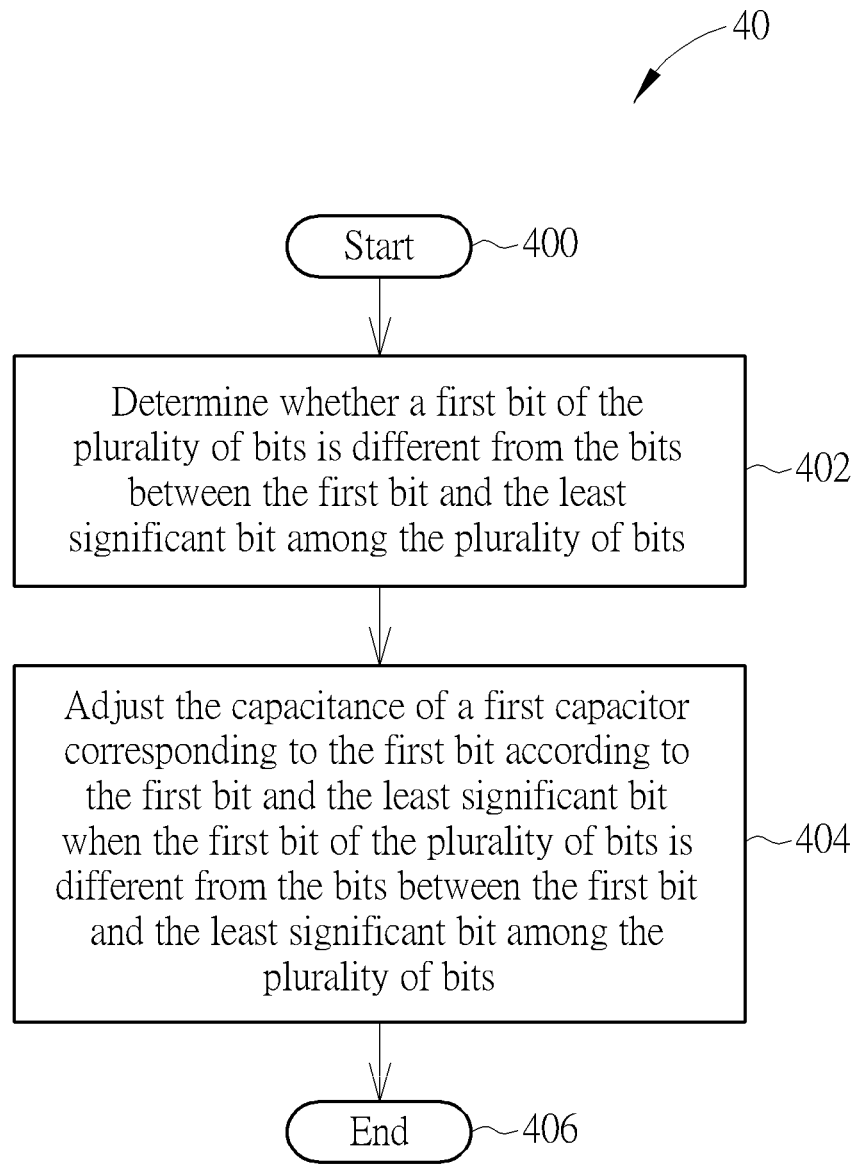
FIG. 4 is a flowchart of a calibration method according to an example of the present invention.

The process of the calibration module 104 adjusting the capacitor array CA in the above examples can be summarized into a calibration method 40 shown in FIG. 4. The calibration method 40 is utilized in a calibration module of an analog-to-digital converting device. The analog-to-digital converting device converts an analog input voltage to a digital output signal with a plurality of bits, wherein the bits except the least significant bit among the plurality of bits are corresponding to capacitances of a plurality of capacitors in the analog-to-digital converting device. The calibration method 40 comprises the following steps:

Step 400: Start.

Step 402: Determine whether a first bit of the plurality of bits is different from the bits between the first bit and the least significant bit among the plurality of bits.

Step 404: Adjust the capacitance of a first capacitor corresponding to the first bit according to the first bit and the least significant bit when the first bit of the plurality of bits is different from the bits between the first bit and the least significant bit among the plurality of bits.

Step 406: End.

According to the calibration method 40, the calibration module detects whether a first bit of the plurality of bits is different from the bits between the first bit and the least significant bit among the plurality of bits. When the first bit of the plurality of bits is different from the bits between the first bit and the least significant bit among the plurality of bits, the calibration module adjusts the capacitance of a first capacitor corresponding to the first bit according to the first bit and the least significant bit. In an example, the calibration module decreases the capacitance of the first capacitor corresponding to the first bit when the first bit is different from the bits between the first bit and the least significant bit and the first bit is different from the least significant bit. In another example, the calibration module increases the capacitance of the first capacitor corresponding to the first bit when the first bit is different from the bits between the first bit and the least significant bit and the first bit is the same as the least significant bit.

In still another example, the calibration module counts the number of times of the first bit is different from the bits between the first bit and the least significant bit and the first bit is different from the least significant bit as a first time, and counts the number of times of the first bit is different from the bits between the first bit and the least significant bit and the first bit is the same as the least significant bit as a second time. When the first time or the second time exceeds a threshold, the calibration module adjusts the capacitance of the first capacitor corresponding to the first bit.

Figure 5:
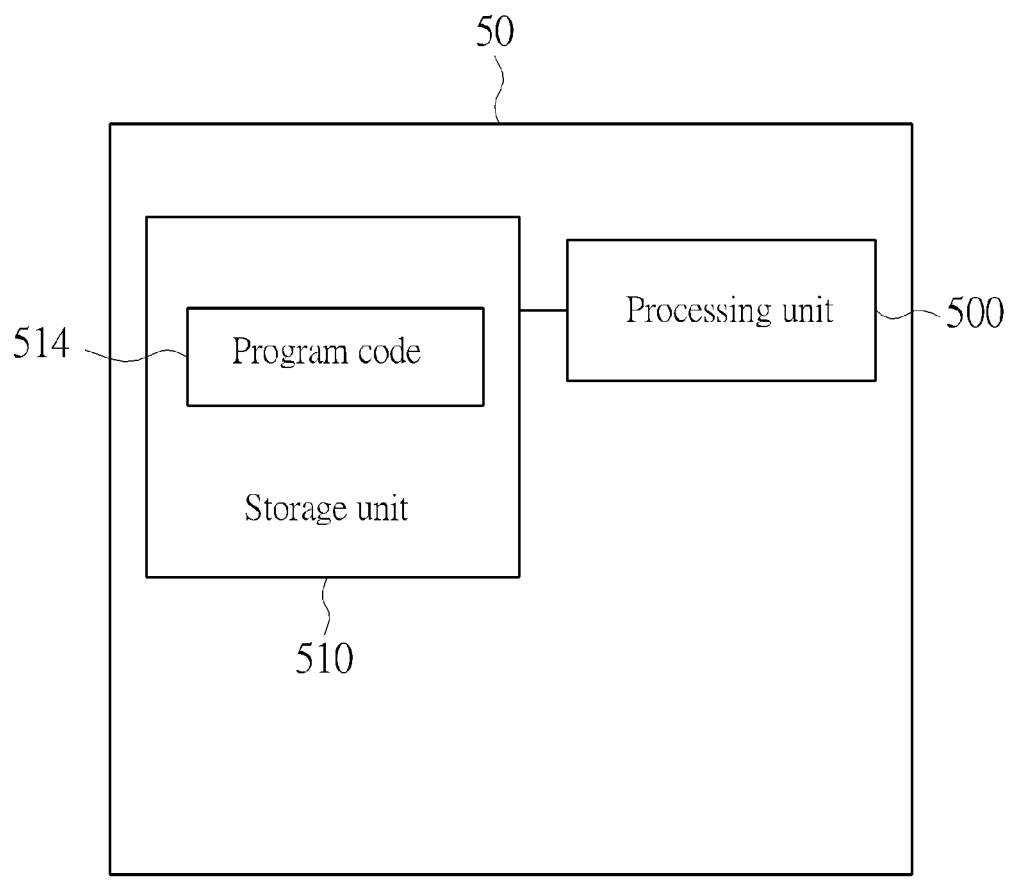
FIG. 5 is a schematic diagram of a calibration module according to an example of the present invention.

According to difference applications and design concepts, the calibration module 104 may be realized in various methods. Please refer to FIG. 5, which is a schematic diagram of a calibration module 50 according to an example of the present invention. The calibration module 50 is utilized in an analog-to-digital converting device and includes a processing unit 500 such as a microprocessor or an Application Specific Integrated Circuit (ASIC) and a storage unit 710. The storage unit 510 may be any data storage device that can store a program code 514, accessed by the computing unit 700. Examples of the storage unit 510 include, but are not limited to, read-only memory, random-access memory, CD-ROM/DVD-ROM, magnetic tape, hard disk, and an optical data storage device.

In an example, the calibration method 40 is compiled into the program code 514 and the calibration module 50 performs the steps 400-406 according to the program code 514 to adjust the capacitances of the plurality of capacitors in the analog-to-digital converting device. The non-ideal effect of the analog-to-digital converting device is eliminated, therefore.

To sum up, the calibration modules of the above examples adjust the capacitances of the plurality of capacitors in the analog-to-digital converting device according to the digital output signal of the analog-to-digital converting device. As a result, the non-ideal effect generated by the process variation can be eliminated without adopting complex algorithms.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An analog-to-digital converting device, comprising:
   a converting module, for sampling an analog input voltage to generate a comparing voltage according to a plurality of sampling signals and generating a comparing signal according to the comparing voltage, wherein the converting module comprises a plurality of capacitors and each of the plurality of capacitors couples between one of the plurality sampling signals and the comparing voltage;

a control module, for adjusting the plurality of sampling signals according to the comparing signal, to generate a digital signal corresponding to the analog input voltage, wherein a plurality of bits of the digital signal respectively are corresponding to capacitances of the plurality of capacitors except the least significant bit among the plurality of bits; and a calibration module, for adjusting the capacitances of a first capacitor among the plurality of capacitors when a number of times that the digital signal equals a pattern exceeds a threshold;

wherein a first bit among the plurality of bits in the pattern is different from the bits between the first bit and the least significant bit of the plurality of bits in the pattern and the first bit is corresponding to the first capacitor.

2. The analog-to-digital converting device of claim 1, wherein the first bit is different from the least significant bit of the plurality of bits in the pattern, and the calibration module decreases a capacitance of a first capacitor corresponding to the first bit among the plurality of bits when the number of times that the digital signal equals the pattern exceeds the threshold.

3. The analog-to-digital converting device of claim 1, wherein the first bit is the same as the least significant bit of the plurality of bits in the pattern, and the calibration module increases a capacitance of a first capacitor corresponding to the first bit among the plurality of bits when the number of times that the digital signal equals the pattern exceeds the threshold.

4. The analog-to-digital converting device of claim 1, wherein the plurality of capacitors comprise at least one variable capacitor and at least one fixed capacitor and the calibration module adjusts a capacitance of the at least one variable capacitor according to the digital signal.

5. The analog-to-digital converting device of claim 1, wherein the comparing voltage is a voltage difference between a first input end and a second input end of the converting module.

6. The analog-to-digital converting device of claim 1, wherein the comparing voltage is a voltage of an input end of the converting module.

7. The analog-to-digital converting device of claim 1, further comprising:

a storage unit, for storing the adjusted capacitances of the plurality of capacitors.

8. A calibration method for an analog-to-digital converting device, which converts an analog input voltage to a digital signal with a plurality of bits and the bits other than the least significant bit among the plurality of bits are corresponding to capacitances of a plurality of capacitors in the analog-to-digital converting device, the calibration method comprising:

detecting a number of times that the digital signal equals a pattern, wherein a first bit among the plurality of bits in the pattern is different from the bits between the first bit and the least significant bit among the plurality of bits in the pattern; and adjusting a capacitance of a first capacitor corresponding to the first bit when the number of times that the digital signal equals the pattern exceeds a threshold.

9. A calibration module for an analog-to-digital converting device, which converts an analog input voltage to a digital signal with a plurality of bits and the bits other than the least significant bit among the plurality of bits are corresponding to capacitances of a plurality of capacitors in the analog-to-digital converting device, the calibration module comprising:

a processing unit; and a storage unit, for storing a program code instructing the processing unit perform the following steps:

detecting a number of times that the digital signal equals a pattern, wherein a first bit among the plurality of bits in the pattern is different from the bits between the first bit and the least significant bit among the plurality of bits in the pattern; and adjusting a capacitance of a first capacitor corresponding to the first bit when the number of times that the digital signal equals the pattern exceeds a threshold.

* * * * *